US011928270B2

United States Patent
Ren et al.

(10) Patent No.: US 11,928,270 B2
(45) Date of Patent: Mar. 12, 2024

(54) QUICK WAVEFORM EDITING METHOD BASED ON MOUSE

(71) Applicant: SHANGHAI NCATEST TECHNOLOGIES CO., LTD., Shanghai (CN)

(72) Inventors: Ryan Ren, Shanghai (CN); Jiqiang Lyv, Shanghai (CN)

(73) Assignee: SHANGHAI NCATEST TECHNOLOGIES CO., LTD, Shanghai (CN)

( * ) Notice: Subject to any disclaimer, the term of this patent is extended or adjusted under 35 U.S.C. 154(b) by 0 days.

(21) Appl. No.: 17/426,216

(22) PCT Filed: Oct. 14, 2020

(86) PCT No.: PCT/CN2020/120846
§ 371 (c)(1),
(2) Date: May 6, 2023

(87) PCT Pub. No.: WO2021/184742
PCT Pub. Date: Sep. 23, 2021

(65) Prior Publication Data
US 2024/0012495 A1    Jan. 11, 2024

(30) Foreign Application Priority Data

Mar. 20, 2020   (CN) .......................... 202010205488.7

(51) Int. Cl.
G06F 3/03      (2006.01)
G06F 3/0362    (2013.01)
(Continued)

(52) U.S. Cl.
CPC .......... *G06F 3/0362* (2013.01); *G06F 3/0485* (2013.01); *G06F 3/0487* (2013.01); *G06F 30/31* (2020.01); *G06F 3/03543* (2013.01)

(58) Field of Classification Search
CPC .... G06F 3/0362; G06F 3/0485; G06F 3/0487; G06F 3/03543; G06F 30/31
See application file for complete search history.

(56) References Cited

U.S. PATENT DOCUMENTS 11,327,521 B1 *   5/2022   Lei ........................ G06F 1/3265
2007/0132733 A1 *   6/2007   Ram .................... G06F 3/03544
345/163

(Continued)

*Primary Examiner* — Kenneth Bukowski
(74) *Attorney, Agent, or Firm* — TIANCHEN LLC.; Yuan R. Li

(57) ABSTRACT

A quick waveform editing method based on a mouse, comprising: receiving an original waveform which needs to be edited and setting an editing task, wherein, the editing task comprises a single waveform editing or a full waveform editing, which is used to edit an edge waveform of at least a pulse wave waveform; monitoring a mouse event and determining the type of the mouse event, wherein, the type of the mouse event comprises a left button event, a mouse wheel event and a right button event; if the type of the mouse event is the left button event, receiving an occurrence of the left button event monitored, which has a selected edge, and moving the selected edge left by a predetermined distance; if the type of the mouse event is the mouse wheel event, receiving an occurrence of the mouse wheel event monitored, which has a selected edge, and moving the selected edge up or down by a predetermined distance; if the type of the mouse event is the right button event, receiving an occurrence of the right button event monitored, which has a selected edge, and moving the selected edge right by a predetermined distance. Therefore, the present invention releases a left mouse button, selects an edge through a mouse wheel and moves to an ideal position.

7 Claims, 3 Drawing Sheets

(51) Int. Cl.
*G06F 3/0485* (2022.01)
*G06F 3/0487* (2013.01)
*G06F 30/31* (2020.01)
*G06F 3/0354* (2013.01)

(56) References Cited

U.S. PATENT DOCUMENTS

| | | | |
|---|---|---|---|
| 2009/0128504 A1* | 5/2009 | Smith | G06F 3/04883 345/173 |
| 2011/0028194 A1* | 2/2011 | Tang | G06F 3/0238 345/172 |
| 2012/0042287 A1* | 2/2012 | Saito | G01R 31/31917 715/856 |
| 2017/0045959 A1* | 2/2017 | Chen | G06F 3/03543 |
| 2020/0272252 A1* | 8/2020 | Flach | H01H 13/807 |

\* cited by examiner a mouse wheel clicks an edge of a selected waveform click a right button to move the edge right click a left button to move the edge left scroll up the mouse wheel to move the edge up scroll down the mouse wheel to move the edge down

QUICK WAVEFORM EDITING METHOD BASED ON MOUSE

CROSS-REFERENCE TO RELATED APPLICATION

This application claims priority of International Patent Application Serial No. PCT/CN2020/120846, filed Oct. 14, 2020, which is related to and claims priority of Chinese patent application Serial No. 202010205488.7 filed on Mar. 20, 2020. The entirety of each of the above-mentioned patent applications is hereby incorporated herein by reference and made a part of this specification.

TECHNICAL FIELD

The disclosure relates to the technical field of Automatic Test Equipment (short for ATE) for semiconductors, and mainly relates to a design of waveform editing software in a host computer and particularly to a quick waveform editing method based on mouse.

BACKGROUND

A automated test device adopts a microcontroller Unit (MCU), a programmable Logic Controller (PLC) and a personal Computer (PC) based on a VB or VC development platform, which bases on customer test requirements, drawings and reference plans and uses TestStand & LabVIEW, JTAG/Boundary Scan and other technologies to develop and design various automated test devices.

The automated test equipment can comprise a set of channels with a certain memory depth, a series of clock generators and multiple power supplies. The clock generators are used to generate pulses, between different test processes, pulse waveforms of frequencies and bandwidths are required differently. Therefore, pulse waveform editing is an indispensable task for using the automated test equipment.

A existing pulse waveform editing program comprises: first selecting a edge of a pulse waveform with a left mouse button, and then drag to realize editing of the pulse waveform, so as to control the pulse waveform precisely only by the left button and a right buttons, but too few shortcut operations can be defined to cover common operations in a waveform editing process, which is tedious and time-consuming.

SUMMARY

In order to overcome above problems, the present invention provides a quick waveform editing method based on a mouse, which uses a mouse wheel, and selects an edge by clicking the mouse wheel, so a left button of the mouse can be released for other purposes, that is, during a waveform editing process, the left button of the mouse is more suitable for operating to move the edge left.

In order to achieve above objectives, a technical solution of the present invention is as follows:

The purpose of the present invention is to provide a quick waveform editing method based on a mouse comprises a left button, a right button, a mouse wheel and a mouse button, comprising following steps:

step S1: receiving an original waveform which needs to be edited and setting an editing task, wherein, the editing task comprises a single waveform editing or a full waveform editing and is used to edit an edge waveform of a pulse wave waveform at least;

step S2: monitoring a mouse event and determining the type of the mouse event, wherein, the type of the mouse event comprises a left button event, a mouse wheel event and a right button event; if the type of the mouse event is the left button event, performing step S3; if the type of the mouse event is the mouse wheel event, performing step S4; if the type of the mouse event is the right button event, performing step S5;

step S3: receiving occurrence of the left button event monitored, which has a selected edge, and moving the selected edge left by a predetermined distance;

step S4: receiving occurrence of the mouse wheel event monitored, which has the selected edge, and moving the selected edge up or down by the predetermined distance;

step S5: receiving occurrence of the right button event monitored, which has the selected edge, and moving the selected edge right by the predetermined distance.

Further, the mouse wheel event is a press event, if the mouse wheel triggers the press event and an edge exists in an press point, then the edge is selected as the selected edge, the press event of the mouse wheel is used to select the edge, a scroll event comprises scrolling up and scrolling down, if the mouse wheel triggers the scrolling up and the selected edge is moved up till the press event of the mouse wheel is over, thus pressing to the mouse wheel is released; if the mouse wheel triggers the scrolling down and the selected edge is moved down till the press event of the mouse wheel is over, thus the pressing to the mouse wheel is released; wherein, the press event of the mouse wheel comprises a rolling pressure operation and a rolling release operation.

Further, the mouse wheel event is a click event, if the mouse wheel triggers the click event and an edge exists in a click point, then the edge is selected as the selected edge, the click event of the mouse wheel is used to select the edge, a scroll event comprises scrolling up and scrolling down, if the mouse wheel triggers the scrolling up and the selected edge is moved up by the predetermined distance; if the mouse wheel triggers the scrolling down and the selected edge is moved down by the predetermined distance.

Further, the left button event comprises a press event and a click event, if the press event occurs which has the select edge, the select edge continues to move left till the left button event is over, the left button is released; if the click event of the lest button occurs which has the select edge, the select edge continues to move left by the predetermined distance; wherein, the click event of the left button comprises a left button pressure operation and a left button release operation.

Further, the right button event comprises a press event and a click event, if the press event occurs which has the select edge, the select edge continues to move right till the right button event is over, the right button is released; if the click event of the right button occurs which has the select edge, the select edge continues to move right by the predetermined distance; wherein, the click event of the right button comprises a right button pressure operation and a right button release operation.

Further, all of the predetermined distances in the left button event, the mouse wheel event and the right button event are determined by the editing task.

It can be seen from above technical solutions that the above technical solutions can release the left button of the mouse for other purposes, and the left button is more suitable for operating to move the edge left, during the waveform editing process.

In addition, the above technical solutions can easily achieve precise control: after selecting the edge by the wheel, the edge is dragged to an ideal position first, and then clicking the left (right) button of the mouse and scrolling up (down) the wheel to move the edge to a desired location.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

Hereinafter, a quick waveform editing method based on a mouse of the present invention will be further described in detail through specific embodiments with reference to FIGS. 1-2.

Figure 1:
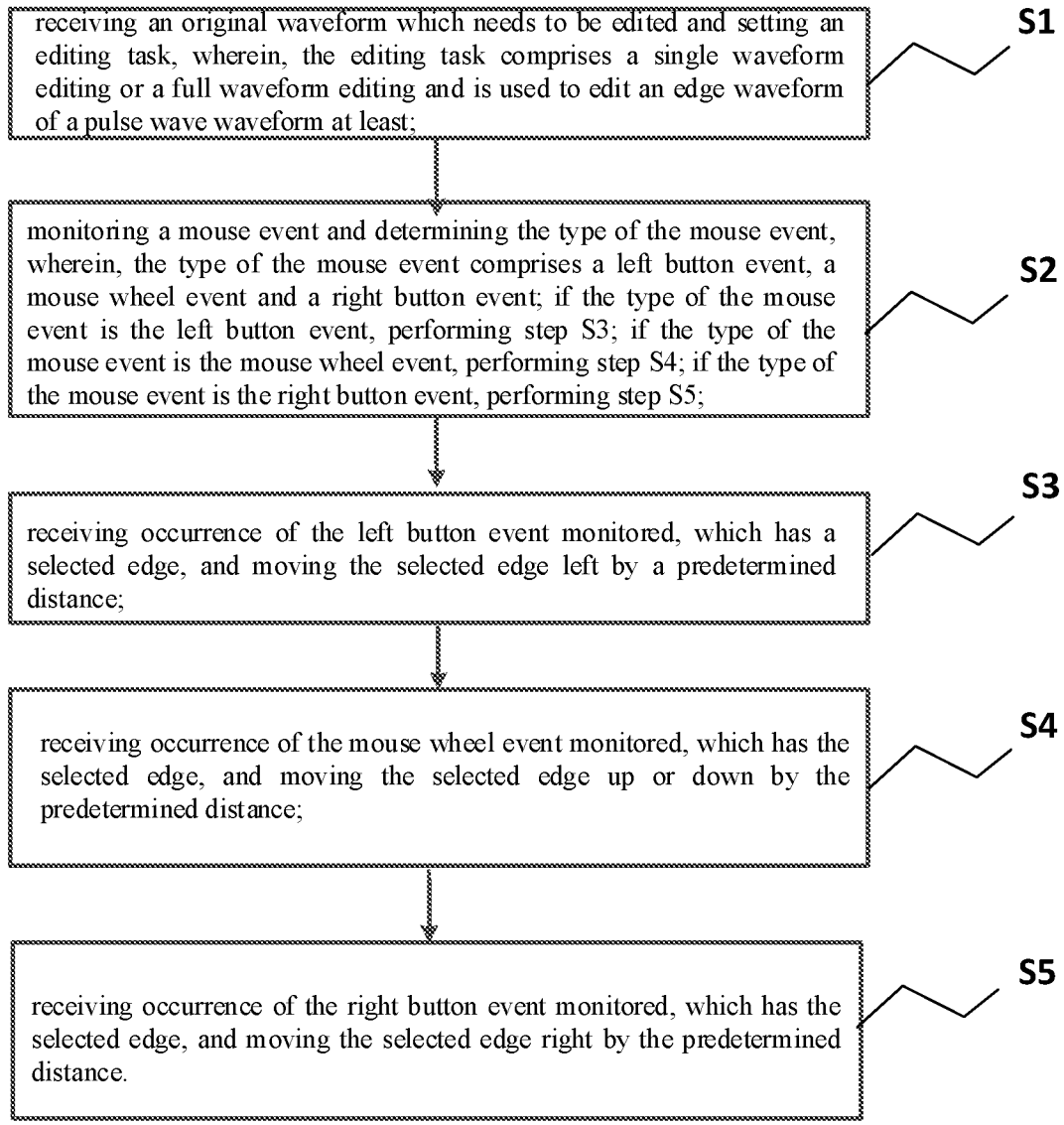
FIG. 1 is a schematic diagram of a quick waveform editing method based on a mouse of the present invention
Figure 2:
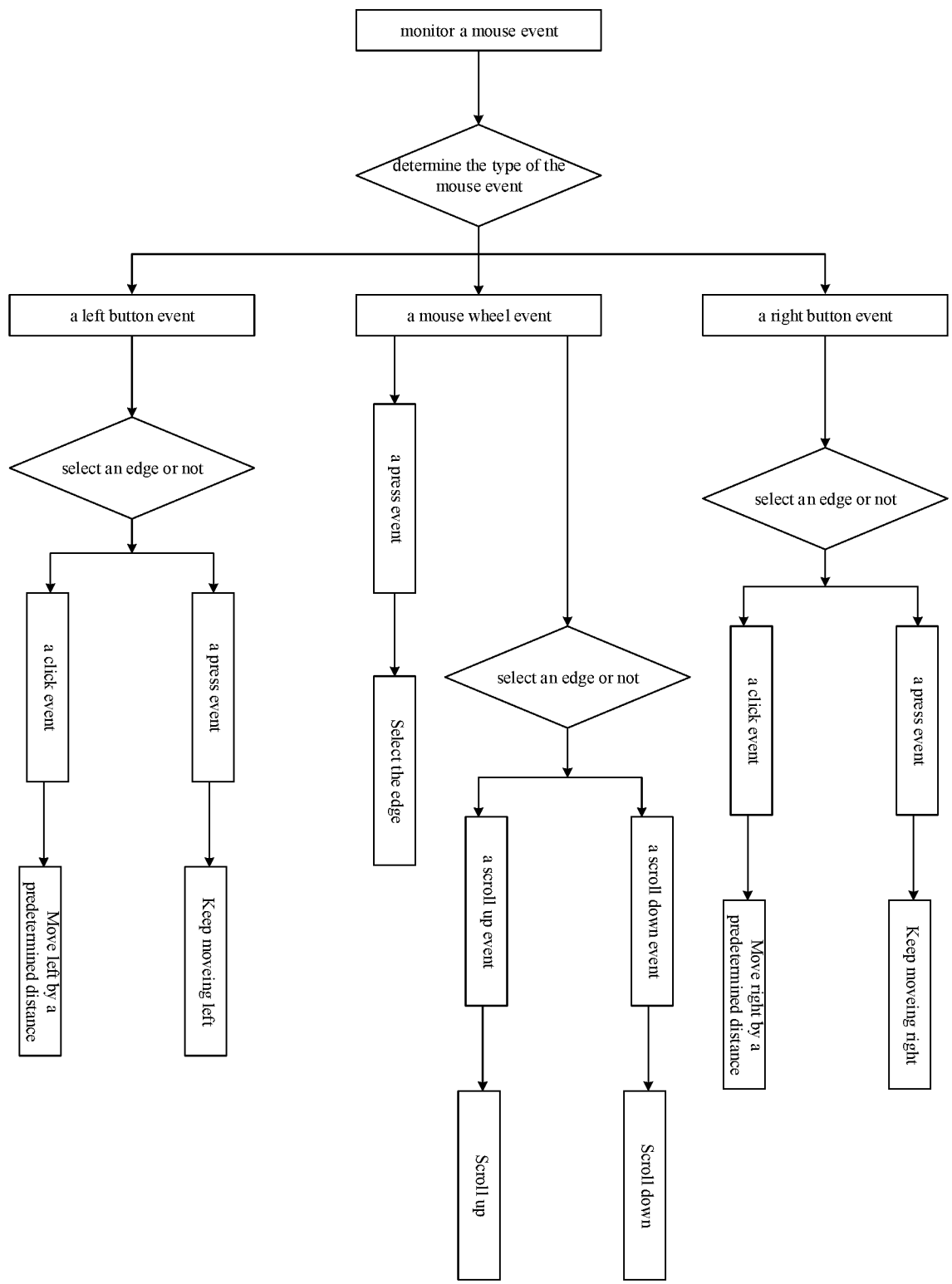
FIG. 2 is a schematic diagram of usage states of a mouse wheel, a left mouse button and a right mouse button in each of steps in a quick waveform editing method based on a mouse of the present invention

Please refer to FIG. 1 and FIG. 2, FIG. 1 is a schematic diagram of a quick waveform editing method based on a mouse of the present invention; FIG. 2 is a schematic diagram of usage states of a mouse wheel, a left mouse button and a right mouse button in each of steps in a quick waveform editing method based on a mouse of the present invention.

As shown in FIG. 1, the quick waveform editing method based on the mouse, which comprises a left button, a right button, a mouse wheel and a mouse button, comprising following steps:

step S1: receiving an original waveform which needs to be edited and setting an editing task, wherein, the editing task comprises a single waveform editing or a full waveform editing, which is used to edit an edge waveform of at least a pulse wave waveform.

In an embodiment of the present invention, the original waveform is usually a series of a pulse wave waveform in a pulse wave. Before starting to edit the waveform, the editing task needs to be set, if only a wave of the pulse wave waveform needs to be set, the editing task can be set as the single waveform editing, and if a series of the pulse wave waveform need to be set, the editing task can be set as the full waveform editing.

Step S2: monitoring a mouse event and determining the type of the mouse event, wherein, the type of the mouse event comprises a left button event, a mouse wheel event and a right button event; if the type of the mouse event is the left button event, performing step S3; if the type of the mouse event is the mouse wheel event, performing step S4; if the type of the mouse event is the right button event, performing step S5.

Please refer to FIG. 2, which is a schematic diagram of usage states of a mouse wheel, a left mouse button and a right mouse button in each of steps in a quick waveform editing method based on a mouse of the present invention.

Step S3: receiving occurrence of the left button event monitored, which has a selected edge, and moving the selected edge left by a predetermined distance.

As shown in FIG. 2, the left button event comprises a press event and a click event, if the press event occurs which has the select edge, the select edge continues to move left till the left button event is over, the left button is released; if the click event of the left button occurs which has the select edge, the select edge continues to move left by the predetermined distance; wherein, the click event of the left button comprises a left button pressure operation and a left button release operation.

Step S4: receiving occurrence of the mouse wheel event monitored, which has the selected edge, and moving the selected edge up or down by the predetermined distance.

As shown in FIG. 2, the mouse wheel event comprises a press event and a scroll event in an embodiment of the present invention. When the mouse wheel event is a press event, if the mouse wheel triggers the press event and an edge exists in an press point, then the edge is selected as the selected edge, the press event of the mouse wheel is used to select the edge, the scroll event comprises scrolling up and scrolling down, if the mouse wheel triggers the scrolling up and the selected edge is moved up till the press event of the mouse wheel is over, thus pressing to the mouse wheel is released; if the mouse wheel triggers the scrolling down and the selected edge is moved down till the press event of the mouse wheel is over, thus the pressing to the mouse wheel is released; wherein, the press event of the mouse wheel comprises a rolling press operation and a rolling release operation.

When the mouse wheel event is a click event, if the mouse wheel triggers the click event and an edge exists in a click point, then the edge is selected as the selected edge, the click event of the mouse wheel is used to select the edge, a scroll event comprises scrolling up and scrolling down, if the mouse wheel triggers the scrolling up and the selected edge is moved up by the predetermined distance; if the mouse wheel triggers the scrolling down and the selected edge is moved down by the predetermined distance.

Step S5: receiving occurrence of the right button event monitored, which has the selected edge, and moving the selected edge right by the predetermined distance.

As shown in FIG. 2, the right button event comprises a press event and a click event, if the press event occurs which has the select edge, the select edge continues to move right till the right button event is over, the right button is released; if the click event of the right button occurs which has the select edge, the select edge continues to move right by the predetermined distance; wherein, the click event of the right button comprises a right button pressure operation and a right button release operation.

It should be noted that all of the predetermined distances in the left button event, the mouse wheel event and the right button event are determined by the editing task.

Figure 3:
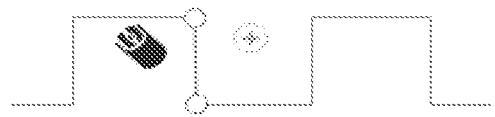
FIG. 3 is a schematic diagram of a specific embodiment of a quick waveform editing method based on a mouse of the present invention
Figure 3:
Figure 3:
Figure 3:
Figure 3:

Please refer to FIG. 3, which is a schematic diagram of a specific embodiment of a quick waveform editing method based on a mouse of the present invention. As shown in FIG. 3, in an embodiment of the present invention, a mouse wheel operation is incorporated into a waveform editing of the editing task, wheel clicking is used as a selection operation of the edge waveform, operations to the edge waveform are corresponded to mouse operations, scrolling up the mouse wheel corresponds to move up the edge waveform, scrolling down the mouse wheel corresponds to move down the edge waveform, left clicking corresponds to move left the edge waveform, and right clicking corresponds to move right the edge waveform, and operations of moving the edge waveform up, down, left, and right correspond to the mouse operations one by one, which is convenient for users to precise control and adjust the edge waveform.

The above are only the embodiments of the present invention. The embodiments are not intended to limit the scope of patent protection of the present invention. Therefore, any equivalent structural changes made using the contents of the description and drawings of the present invention should also be included in the protection of the present invention. Within range.

The above descriptions are only the preferred embodiments of the present invention, and the described embodiments are not used to limit the scope of patent protection of the present invention. Therefore, any equivalent structural changes made using the contents of the description and drawings of the present invention should be included in the same reasoning. Within the protection scope of the appended claims of the present invention.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A quick waveform editing method based on a mouse comprising a left button, a right button, a mouse wheel and a mouse button, comprising following steps:
   step S1: receiving an original waveform which needs to be edited and setting an editing task, wherein, the editing task comprises a single waveform editing or a full waveform editing and is used to edit an edge waveform of a pulse wave waveform at least;
   step S2: monitoring a mouse event and determining a type of the mouse event, wherein, the type of the mouse event comprises a left button event, a mouse wheel event and a right button event; in a case that the type of the mouse event is the left button event, performing step S3; in a case that the type of the mouse event is the mouse wheel event, performing step S4; in a case that the type of the mouse event is the right button event, performing step S5;
   step S3: receiving occurrence of the left button event monitored, which has a selected edge, and moving the selected edge left by a predetermined distance;
   step S4: receiving occurrence of the mouse wheel event monitored, which has thselected edge, and moving the selected edge up or down by the predetermined distance; and
   step S5: receiving occurrence of the right button event monitored, which has thselected edge, and moving the selected edge right by the predetermined distance;
   wherein the mouse wheel event comprises a press event and a scroll event, in a case that the mouse wheel triggers the press event and an edge exists in an press point, then the edge is selected as the selected edge, the press event of the mouse wheel is used to select the edge, the scroll event comprises scrolling up and scrolling down, in a case that the mouse wheel triggers the scrolling up, the selected edge is moved up till the press event of the mouse wheel is over, which is indicated by releasing the pressing of the mouse wheel; and in a case that the mouse wheel triggers the scrolling down, the selected edge is moved down till the press event of the mouse wheel is over, which is indicated by releasing the pressing of the mouse wheel; wherein, the press event of the mouse wheel comprises a rolling press operation and a rolling release operation.

2. The quick waveform editing method of claim 1, wherein the mouse wheel event is a click event, in a case that the mouse wheel triggers the click event and an edge exists in a click point, the edge is selected as the selected edge, the click event of the mouse wheel is used to select the edge, in a case that the mouse wheel triggers the scrolling up, the selected edge is moved up by the predetermined distance, and in a case that the mouse wheel triggers the scrolling down, the selected edge is moved down by the predetermined distance.

3. The quick waveform editing method of claim 2, wherein all of the predetermined distances in the left button event, the mouse wheel event and the right button event are determined by the editing task.

4. The quick waveform editing method of claim 1, wherein the left button event comprises a press event and a click event, in a case that the press event occurs which has the selected edge, the selected edge continues to move left till the left button event is over, which is indicated by releasing the left button; in a case that the click event of the left button occurs which has the selected edge, the selected edge continues to move left by the predetermined distance; wherein, the click event of the left button comprises a left button press operation and a left button release operation.

5. The quick waveform editing method of claim 4, wherein all of the predetermined distances in the left button event, the mouse wheel event and the right button event are determined by the editing task.

6. The quick waveform editing method of claim 1, wherein the right button event comprises a press event and a click event, in a case that the press event occurs which has the selected edge, the selected edge continues to move right till the right button event is over, which is indicated by releasing the right button; and in a case that the click event of the right button occurs which has the selected edge, the selected edge continues to move right by the predetermined distance; wherein, the click event of the right button comprises a right button press operation and a right button release operation.

7. The quick waveform editing method of claim 6, wherein all of the predetermined distances in the left button event, the mouse wheel event and the right button event are determined by the editing task.

* * * * *